(12) United States Patent
Straeussnigg et al.

(10) Patent No.: US 9,380,381 B2
(45) Date of Patent: Jun. 28, 2016

(54) MICROPHONE PACKAGE AND METHOD FOR PROVIDING A MICROPHONE PACKAGE

(71) Applicant: Infineon Technologies AG, Neubiberg (DE)

(72) Inventors: Dietmar Straeussnigg, Villach (AT); Andreas Wiesbauer, Poertschach (AT); Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 73 days.

(21) Appl. No.: 14/218,602

(22) Filed: Mar. 18, 2014

(65) Prior Publication Data

US 2015/0271585 A1  Sep. 24, 2015

(51) Int. Cl.
| | |
|---|---|
| *H04R 3/00* | (2006.01) |
| *H04M 1/12* | (2006.01) |
| *H04M 1/18* | (2006.01) |
| H04R 25/00 | (2006.01) |
| H04R 1/08 | (2006.01) |
| H04R 19/00 | (2006.01) |
| H04R 19/01 | (2006.01) |

(52) U.S. Cl.
CPC . *H04R 3/00* (2013.01); *H04M 1/12* (2013.01); *H04M 1/18* (2013.01); *H04R 1/08* (2013.01); *H04R 1/086* (2013.01); *H04R 19/005* (2013.01); *H04R 19/016* (2013.01); *H04R 25/43* (2013.01); *H04R 25/50* (2013.01); *H04R 25/502* (2013.01); *H04R 25/505* (2013.01); *H04R 2420/01* (2013.01)

(58) Field of Classification Search
CPC ........ H04R 25/00; H04R 25/43; H04R 25/50; H04R 25/502; H04R 25/505; H04R 2420/01; H04R 2420/03; H04R 2420/05; H04R 3/00; H03M 1/18–1/188

See application file for complete search history.

(56) References Cited

U.S. PATENT DOCUMENTS

| | | | |
|---|---|---|---|
| 6,097,443 A * | 8/2000 | Volmari | 348/572 |
| 7,952,502 B2 * | 5/2011 | Kolze et al. | 341/118 |
| 8,472,646 B2 * | 6/2013 | Chen et al. | 381/175 |
| 8,606,381 B2 * | 12/2013 | Zhang et al. | 700/94 |
| 9,071,268 B1 * | 6/2015 | Schneider et al. | |
| 9,131,296 B2 * | 9/2015 | Johnson | H04R 3/007 |
| 9,161,123 B2 * | 10/2015 | Schuurmans | H04R 3/00 |
| 9,197,971 B2 * | 11/2015 | Michael | H04R 5/04 |
| 2003/0091207 A1 * | 5/2003 | Killion et al. | 381/321 |
| 2003/0223592 A1 * | 12/2003 | Deruginsky et al. | 381/92 |
| 2007/0120721 A1 * | 5/2007 | Caduff et al. | 341/155 |
| 2008/0075309 A1 * | 3/2008 | Chen et al. | 381/175 |
| 2011/0026739 A1 * | 2/2011 | Thomsen et al. | 381/120 |
| 2014/0341397 A1 * | 11/2014 | Straeussnigg et al. | 381/120 |

(Continued)

FOREIGN PATENT DOCUMENTS

EP  1753130 A1  2/2007

*Primary Examiner* — Curtis Kuntz
*Assistant Examiner* — Joshua Kaufman
(74) *Attorney, Agent, or Firm* — Slater Matsil, LLP

(57) ABSTRACT

A microphone package comprises a microphone. The microphone package also comprises a first analog-to-digital converter coupled to the microphone to provide a first digital signal. The microphone package further comprises a second analog-to-digital converter coupled to the microphone to provide a second digital signal. Furthermore, the microphone package comprises a circuit coupled to the first analog-to-digital converter and the second analog-to-digital converter to provide the microphone signal.

16 Claims, 6 Drawing Sheets

(56) References Cited

U.S. PATENT DOCUMENTS

| | | |
|---|---|---|
| 2015/0042496 A1* | 2/2015 | Straeussnigg et al. ........ 341/118 |
| 2015/0086043 A1* | 3/2015 | Sridharan et al. ............ 381/111 |
| 2015/0271585 A1* | 9/2015 | Straeussnigg ............ H04R 3/00 381/369 |
| 2015/0281836 A1* | 10/2015 | Nguyen ................... H04R 3/00 381/120 |

\* cited by examiner

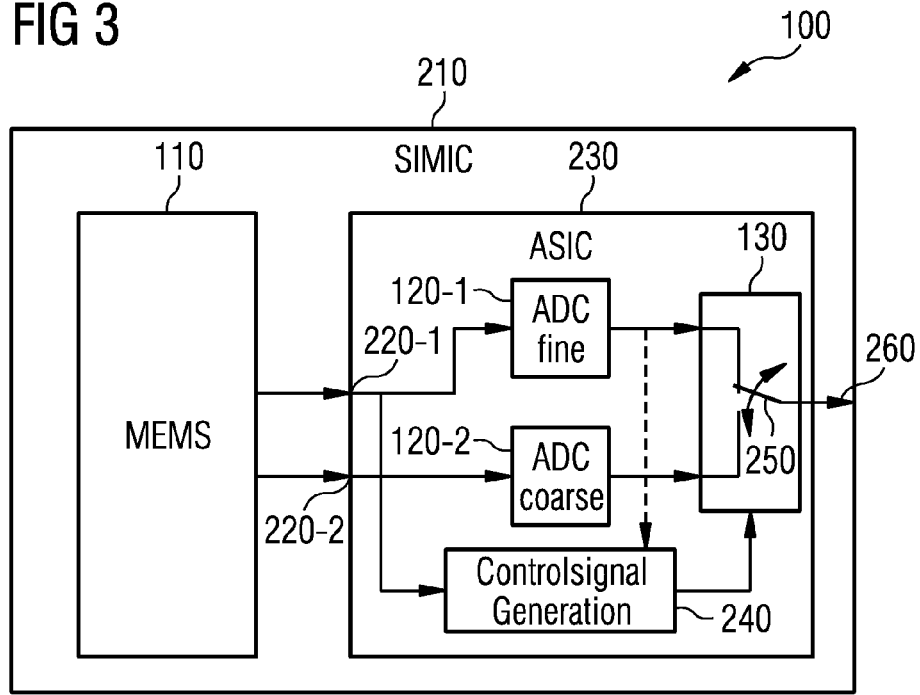
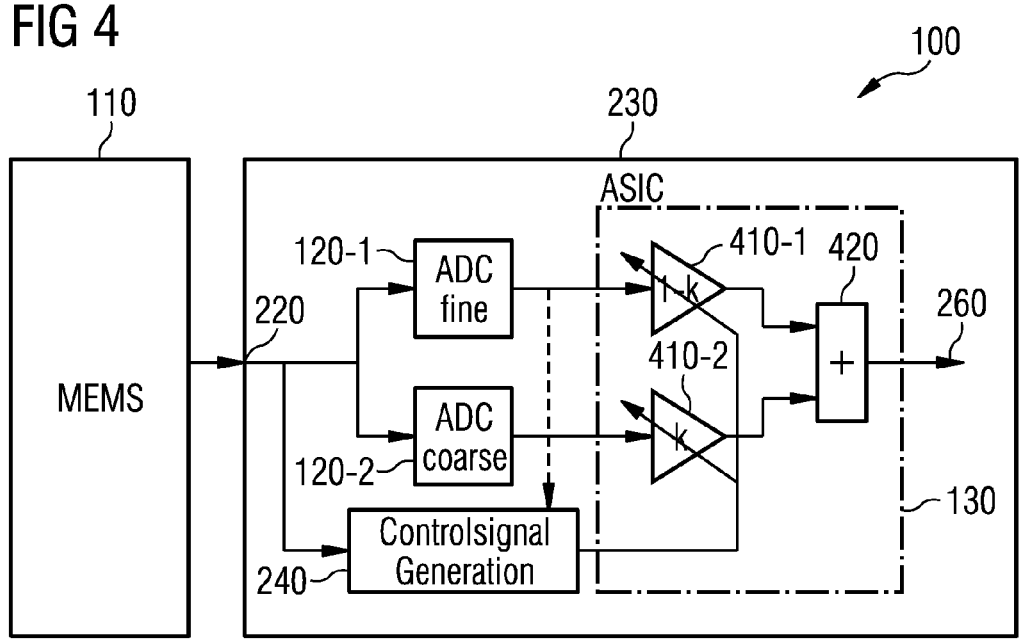

MICROPHONE PACKAGE AND METHOD FOR PROVIDING A MICROPHONE PACKAGE

TECHNICAL FIELD

Embodiments relate to a microphone package for providing a microphone signal and to a method for providing a microphone package.

BACKGROUND

Microphones are used to record ambient noise or sound. Telecommunication applications often use microphones of small scale. An example for a small-scale microphone is a silicon-microphone or a microphone implemented as a micro-electro-mechanical system (MEMS). For some today applications, processing of sound levels up to 140 dBSPL has to be achieved. This may increase a dynamic range to be covered by a signal path, which in turn may affect an application specific integrated circuit (ASIC) configured to process a microphone signal.

A conventional approach to fulfill higher requirements to the increased dynamical range uses two analog-to-digital converters (ADCs). A coder-decoder (codec) determines an output signal from the first or the second ADC, which is then used for further processing in a digital signal processor (DSP). This may however require presence of at least two interfaces for signal transmission between the ADCs and the codec.

It is desirable to improve a concept for providing a microphone signal from a microphone package.

SUMMARY OF THE INVENTION

An embodiment relates to a microphone package for providing a microphone signal. The microphone package comprises a microphone. The microphone package also comprises a first analog-to-digital converter coupled to the microphone to provide a first digital signal. The microphone package further comprises a second analog-to-digital converter coupled to the microphone to provide a second digital signal. Furthermore, the microphone package comprises a circuit coupled to the first analog-to-digital converter and the second analog-to-digital converter to provide the microphone signal.

A further embodiment relates to a microphone package for providing a microphone signal. The microphone package comprises a micro-electro-mechanical microphone. The microphone package also comprises a first analog-to-digital converter coupled to the micro-electro-mechanical microphone to provide a first digital signal. The microphone package further comprises a second analog-to-digital converter coupled to the micro-electro-mechanical microphone to provide a second digital signal. Furthermore, the microphone package comprises a circuit coupled to the first analog-to-digital converter and the second analog-to-digital converter. The circuit is configured to provide the microphone signal to an output terminal of the microphone package.

Another embodiment relates to a method for providing a microphone package. The method comprises a providing of an integrated circuit. The integrated circuit therein comprises a first analog-to-digital converter to provide a first digital signal, a second analog-to-digital converter to provide a second digital signal and a circuit configured to provide a microphone signal based on the first digital signal and the second digital signal. The method also comprises a coupling of a microphone to the first analog-to-digital converter and to the second analog-to-digital converter. The method further comprises integrating the microphone, the first analog-to-digital converter and the second analog-to-digital converter in a common package.

BRIEF DESCRIPTION OF THE DRAWINGS

Some example embodiments of apparatuses and/or methods will be described in the following by way of example only, and with reference to the accompanying figures, in which

FIG. 3 shows a block diagram of the components of a third embodiment of a microphone package;

FIG. 4 shows a block diagram of the components of a fourth embodiment of a microphone package;

DETAILED DESCRIPTION OF ILLUSTRATIVE EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
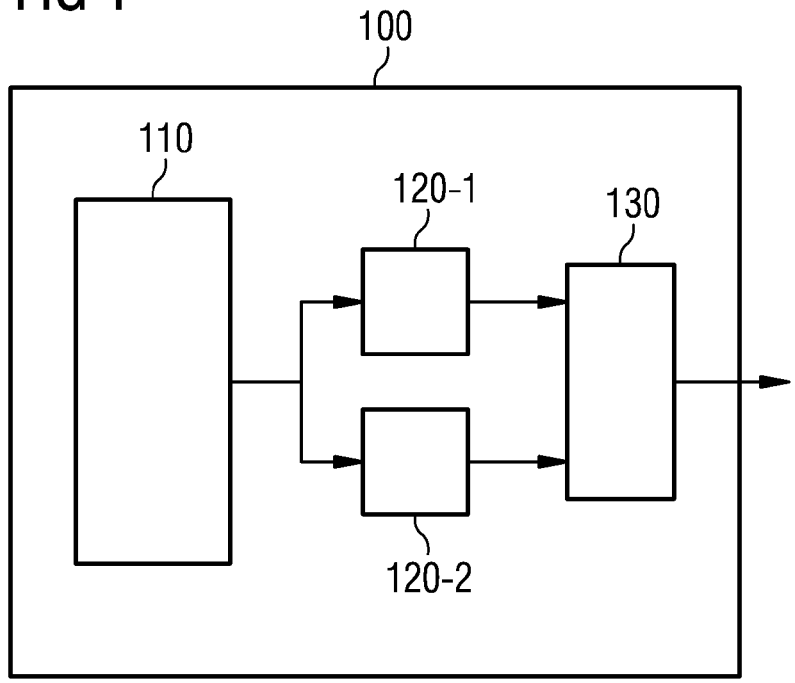
FIG. 1 shows a block diagram of the components of a first embodiment of a microphone package.

FIG. 1 schematically illustrates a microphone package 100 for providing a microphone signal. Microphone package 100 comprises a microphone 110. Microphone package 100 also comprises a first ADC 120-1 coupled to microphone 110 to provide a first digital signal. Microphone package 100 further comprises a second ADC 120-2 coupled to microphone 110 to provide a second digital signal. Furthermore, microphone package 100 comprises a circuit 130 coupled to first ADC 120-1 and second ADC 120-1 to provide the microphone signal. It may thus be possible to provide the microphone signal at a single output terminal. The microphone signal may in some cases have an increased quality compared to conventional solutions. This may enable a more comfortable usage by a customer.

Microphone 110 may, for example, be a micro-electro-mechanical system (MEMS), and may also be referred to as an HSPL microphone. Microphone 110 may receive an acoustic signal and may send an analog signal to first ADC 120-1 and to second ADC 120-2. Signals may comprise electric signals, for example, a current or a voltage, and be of analog or of digital form, unless stated otherwise. Signals may further assume discrete or continuous values, or comprise both discrete and continuous periods. Circuit 130 may for instance comprise a switch or other means to combine a multitude of signals such as, e.g., an additive combiner, a multiplier, a divider or an amplifier. Moreover, circuit 130 may comprise a programmable hardware component such as a chip or a processor.

In some embodiments microphone package 100 comprises a common housing enclosing microphone 110, first ADC 120-1, second ADC 120-2 and circuit 130 at least partly. Microphone package 100 may further comprise a sealing compound enclosing at least one of microphone 110, first ADC 120-1, second ADC 120-2 and circuit 130. Microphone package 100 may also comprise terminals to electrically connect all components of microphone package 100 to further circuitry. Furthermore, microphone package 100 may comprise a single supply voltage terminal to receive a common supply voltage for microphone 110, first ADC 120-1, second ADC 120-2 and circuit 130. Moreover, microphone package 100 may comprise a sound port in the package to enable pressure variations at a membrane of microphone 110 within the package.

Figure 2:
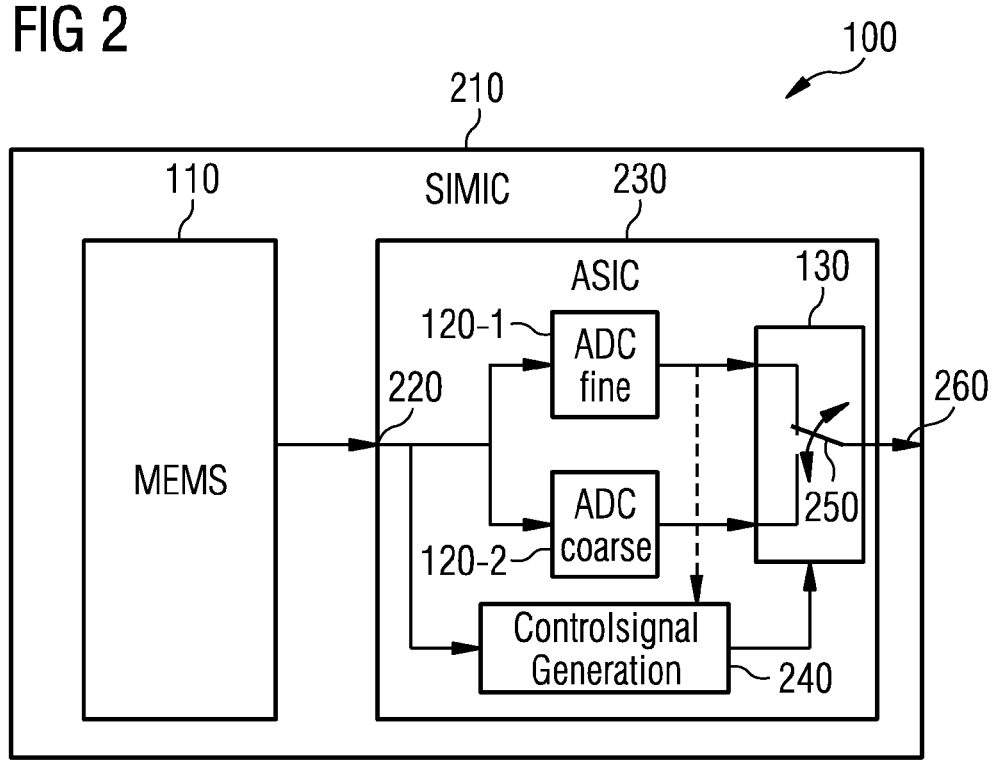
FIG. 2 shows a block diagram of the components of a second embodiment of a microphone package.

FIG. 2 shows a more complex embodiment of a microphone package 100. Components explained before in a previous context will not be described again in the following. Merely differences with respect to previous figures will be addressed. Microphone 100 may, for example, comprise a silicon microphone (SIMIC) 210. SIMIC 210 itself comprises micro-electro-mechanical microphone (MEMS microphone) 110 to provide an analog signal based on an acoustic signal to an input interface 220 located on an ASIC 230. The analog signal is passed to first ADC 120-1 located on ASIC 230, second ADC 120-2 located on ASIC 230 and a controller 240 located on ASIC 230. ASIC 230 and microphone 110 may be mounted on a common integrated circuit board in some embodiments. First ADC 120-1 has a fine resolution and second ADC 120-2 has a coarse resolution in comparison to each other, respectively, or in other words, first ADC 120-1 has a dynamic range which is smaller than a dynamic range of second ADC 120-2. Henceforth first ADC 120-1 is also denominated fine ADC 120-1, and second ADC 120-2 is denominated coarse ADC 120-2 thereafter. The dynamic range may be an intrinsic quantity or be a consequence of a pre-amplification per-formed. Controller 240 is configured to control a mode of operation of circuit 130. In some embodiments controller 240 may comprise or may be a control signal generator 240. Control signal generator 240 may optionally receive a feedback signal based on a first digital signal from fine ADC 120-1. Control signal generator 240 provides a control signal based on the analog signal to circuit 130. For example, control signal generator 240 may be configured to change a mode of operation if a level of an input to fine ADC 120-1 or coarse ADC 120-2 exceeds a predetermined threshold. The analog signal herein represents a common input signal of fine ADC 120-1 and coarse ADC 120-2.

The control signal may optionally be based on the feedback signal. Circuit 130 comprises a switch 250 to pass either the first or the second digital signal in reaction to the control signal to an output terminal 260. In other words, the microphone signal may thus correspond to the first or to the second digital signal. Output terminal 260 is provided by microphone package 100. By this implementation usage of additional output terminals may no longer be necessary. Furthermore, usage of an additional core for signal processing or calibration to compensate MEMS process fluctuations by a customer may no longer be required.

FIG. 3 shows a further embodiment of a microphone package 100. In contrast to the previous embodiment (compare FIG. 2) the MEMS microphone 110 provides a first analog signal to fine ADC 120-1 via a first input port 220-1 and a second signal to coarse ADC 120-2 via a second input port 220-2. MEMS microphone 110 may be segmented in one embodiment. That is to say, MEMS microphone 110 may comprise at least a first membrane portion having a first sensitivity and a second membrane portion having a second sensitivity other than the first sensitivity. In another embodiment microphone package 100 may comprise a further MEMS microphone so that the first analog signal is provided by MEMS microphone 110 and the second analog signal is provided by the further MEMS microphone, or vice versa. Control signal generator 240 receives the first analog signal in one embodiment or the second analog signal in another embodiment. In some embodiments control signal generator 240 receives both the first and the second analog signal. Effects that may arise due to switching at circuit 130 may be notably reduced by the embodiments shown in FIGS. 2 and 3.

Another embodiment of a microphone package 100 with an implementation for weighted switching or fading is shown in FIG. 4. Circuit 130 therein comprises a first signal amplifier 410-1 to receive the first digital signal and the control signal and a second signal amplifier 410-2 to receive the second digital signal and the control signal. The control signal may comprise or indicate a first weighting coefficient 1−k and a second weighting coefficient k, with k being a number larger or equal to 0 and lesser or equal to 1. The first and second weighting coefficients are determined by control signal generator 240. The first digital signal is amplified by first weighting coefficient 1−k, and the second digital signal is amplified by second weighting coefficient k. First signal amplifier 410-1 provides a first amplified signal to a summing amplifier 420 of circuit 130, and second signal amplifier 410-1 provides a second amplified signal to summing amplifier 420. Summing amplifier 420 provides the microphone signal. The microphone signal may hence comprise a combination of the first digital signal, a first weighting coefficient, the second digital signal and a second weighting coefficient. In this embodiment the combination resembles a sum of a product of the first digital signal and the first weighting coefficient 1−k and a product of the second digital signal and the second weighting coefficient k. In other words, the sum of the first and the second digital signals has a total amplification of 1. In other embodiments an amplification factor may also differ from 1. Switching effects may possibly be further reduced this way, as illustrated in FIGS. 6 to 9.

Figure 5:
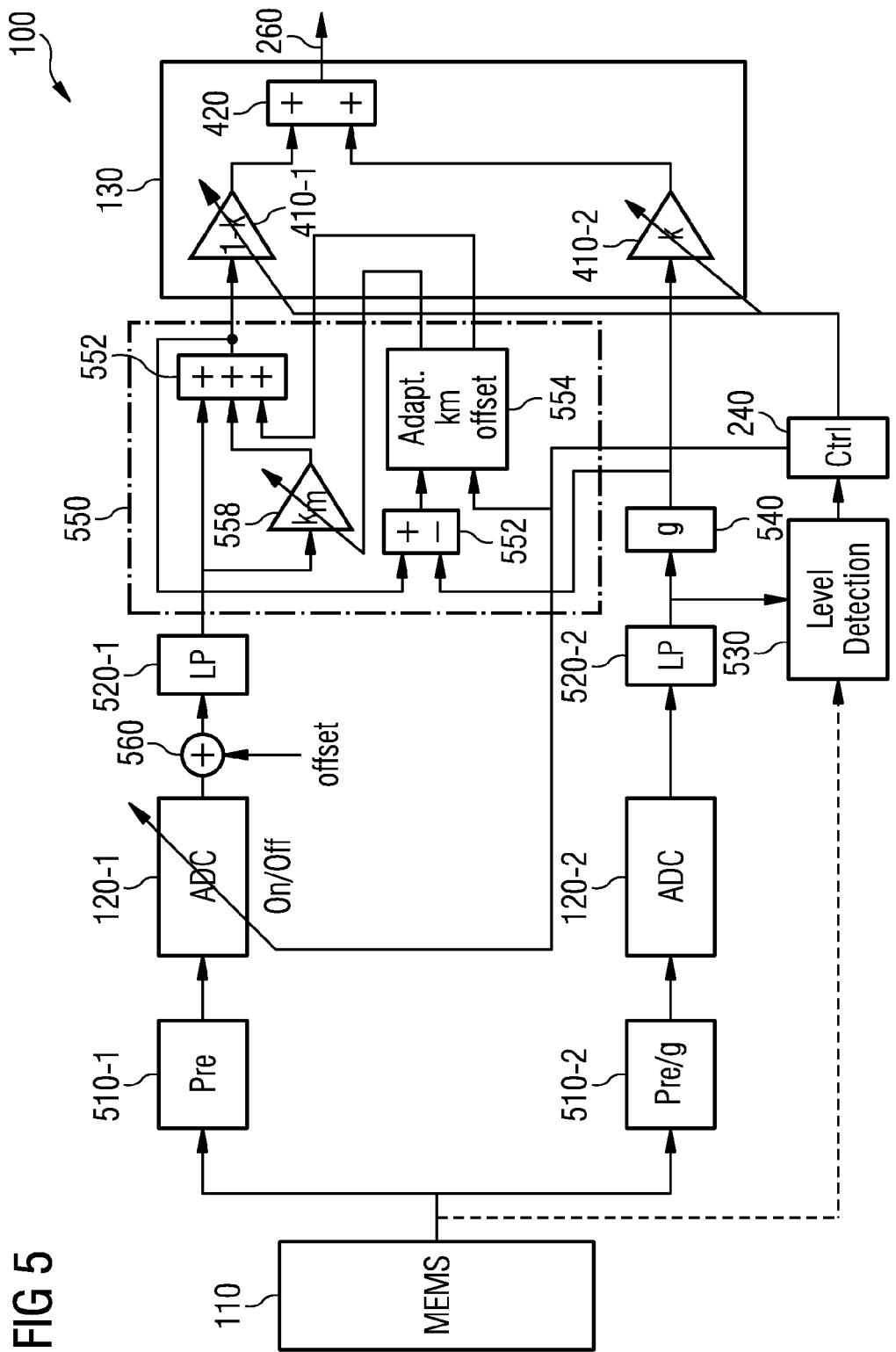
FIG. 5 shows a block diagram of an embodiment of a microphone package considering offset and gain mismatch.

FIG. 5 shows a block diagram of an embodiment of a microphone package 100 considering also possible offsets and gain mismatches. MEMS microphone 110 provides an analog signal, which acts as a common input signal for fine ADC 120-1 and coarse ADC 120-2. A representation of the analog signal passes a first pre-amplifier 510-1 before being received by fine ADC 120-1, and a further representation of the analog signal passes a second pre-amplifier 510-1 before being received by coarse ADC 120-1. An amplification performed by second pre-amplifier 510-2 differs by a factor 1/g from an amplification performed by first pre-amplifier 510-1. After conversion into digital form by fine and coarse ADCs 120-1; 120-2, the first and second digital signal are passed through a filter, which in FIG. 5 is a first low-pass filter 520-1 for the first digital signal and a second low-pass filter 520-2 for the second digital signal. The low-pass filters may be, e.g., of first or of second order. After passing second low-pass filter 520-2, a representation of the second digital signal and, optionally or alternatively, the analog signal are provided to a means of level detection 530, which in reaction initiates generation of the control signal by control signal generator 240. A further representation of the second digital signal passes a digital signal multiplier 540 to multiply the further representation of the second digital signal with a gain factor g. In other words, a factor by which a sensitivity (or a dynamical range) of coarse ADC 120-2 differs from a sensitivity of fine ADC 120-1 may be at least partially compensated by applying a factor g. The further representation of the analog signal received by coarse ADC 120-2 is scaled by factor 1/g and the second digital signal provided by coarse ADC 120-2 is rescaled by factor g. In some embodiments g is a factor larger than unity, for example, g=2. It may hence be possible to use ADCs having an essentially equal intrinsic sensitivity or resolution. It may further be possible to use ADCs of a common type, which may be helpful to decrease mismatch effects.

First low-pass filter 520-1 provides the first digital signal and signal multiplier 540 provides the further representation of the second digital signal to a gain mismatch and offset control circuit 550 (abbreviated "GMOC circuit" in the following). GMOC circuit 550 is configured to disentangle and compensate gain mismatch between a first signal path comprising fine ADC 120-1 and a second signal path comprising coarse ADC 120-2 and an offset value which may be added or subtracted using a signal combiner 560 arranged between fine ADC 120-1 and first low-pass filter 520-1. GMOC circuit 550 is arranged as a control loop in FIG. 5, using the second digital signal as a reference value. GMOC circuit 550 is configured to perform a correction to the first digital signal, providing a corrected first digital signal. A differential value between the corrected first digital signal and the second digital signal is calculated at a primary signal adder 552 and used to trigger, to repeat or to terminate the control loop. A comparison between the differential value and an error interval or threshold value may serve as an initial condition. The differential value may approach zero with each additional step of iteration. To initiate mathematical operations in reaction to the initial condition, GMOC circuit 550 comprises a controller 554. The mathematical operations are per-formed by a secondary signal adder 556 and comprise a sum of the first digital signal, an offset value and a product of the first digital signal and a correction factor km, with positive or negative sign, respectively. Correction factor km may at least partially compensate gain mismatch and is applied to a further representation of the first differential signal by a corrective amplifier 558 arranged between first low-pass filter 520-1 and secondary signal adder 556. Offset and correction factor km may be determined by controller 556 based on the differential value or the second digital signal value. GMOC circuit 550 continuously provides the corrected first digital signal to first signal amplifier 410-1. The representation of the second digital signal is provided to second signal amplifier 410-2, and weighted switching may be performed as described in the context of FIG. 4.

Some embodiments, such as the embodiment shown in FIG. 5, may enable an efficient compensation of nonlinearities (e.g., gain mismatch, phase mismatch, offset) by digital calibration. Calibration may be performed once or several times during operation. By using a so-called gradient algorithm, implementation may be further simplified. The embodiment in FIG. 5 is further related to a digital GMOC circuit.

Figure 6:
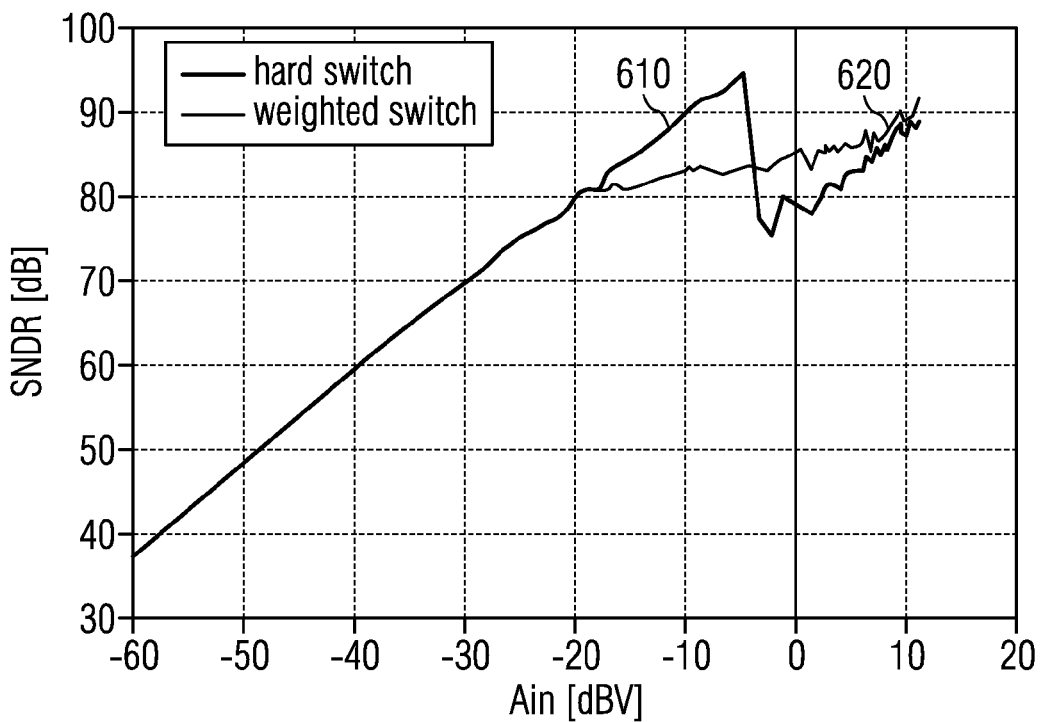
FIG. 6 shows a graphic of a signal-to-noise and distortion ratio in a microphone package.

FIGS. 6 to 9 display various signal characteristics corresponding to the microphone package 100 explained in FIG. 5. FIG. 6 shows a graphic comparing signal-to-noise and distortion ratios (SNDRs) for a hard-switch implementation 610 (see circuit 130 in FIG. 2 or 3) and for a weighted-switch implementation 620 (see circuit 130 in FIG. 4). The graph representing the hard-switch implementation 610 exhibits a steep drop-off by about 20 dB in SNDR at around −5 dBV. By weighted-switch implementation 620 this drop-off that may in some cases lead to audible distortions may be reduced or even avoided.

Figure 7:
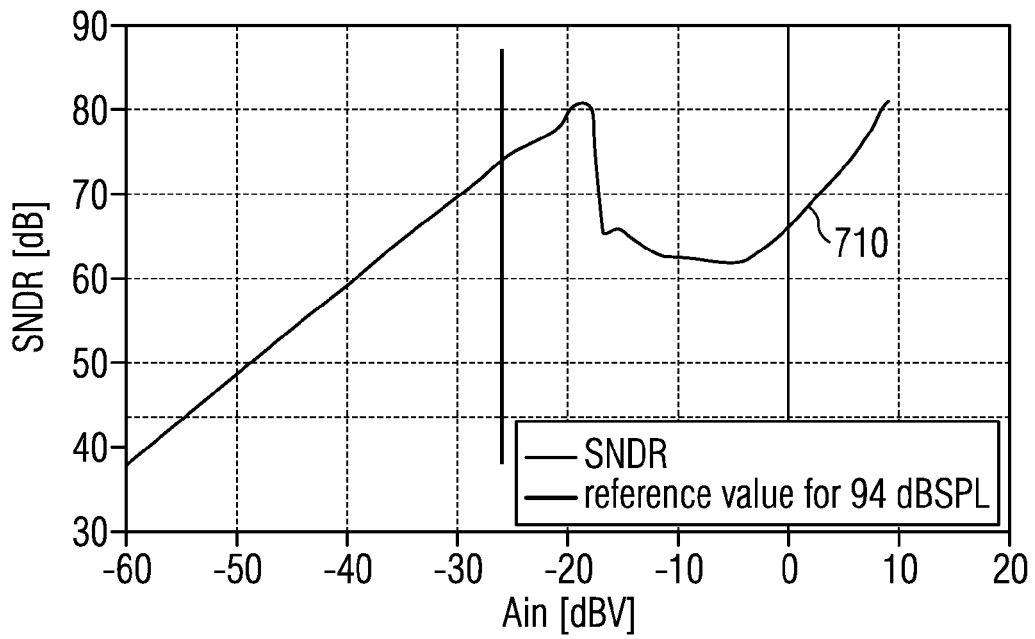
FIG. 7 shows a graphic of a signal-to-noise and distortion ratio in a microphone package considering offset.
Figure 8:
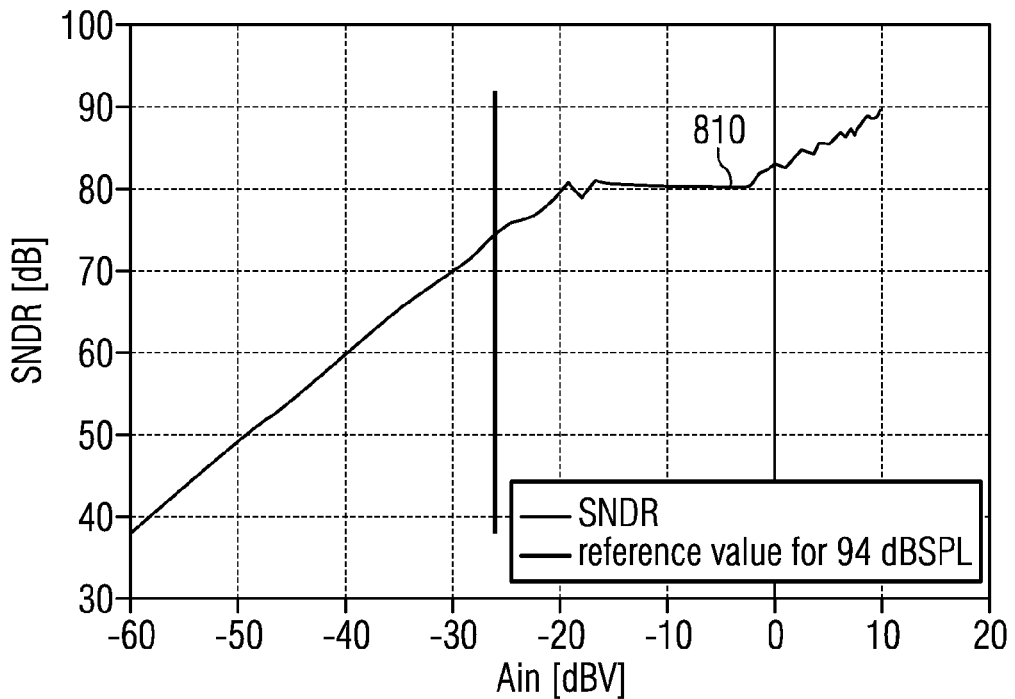
FIG. 8 shows a graphic of a signal-to-noise and distortion ratio in a microphone package considering offset and weighted switch.

FIGS. 7 and 8 show a comparison of SNDRs under presence of an offset. A graph 710 in FIG. 7 shows a course of SNDR if no offset compensation takes place and a graph 810 in FIG. 8 shows a course of SNDR if a digital offset compensation is performed as described in the context of FIG. 5. Vertical lines mark a reference value of 94 dBSPL in FIGS. 7 and 8. Graph 710 exhibits a dip of up to 20 dB in the SNDR extending over an interval between about −20 and 10 dBV. The dip vanishes in graph 810 where the offset is compensated. Due to adaption settings a residual error of about 0.1 mV may however occur.

Figure 9:
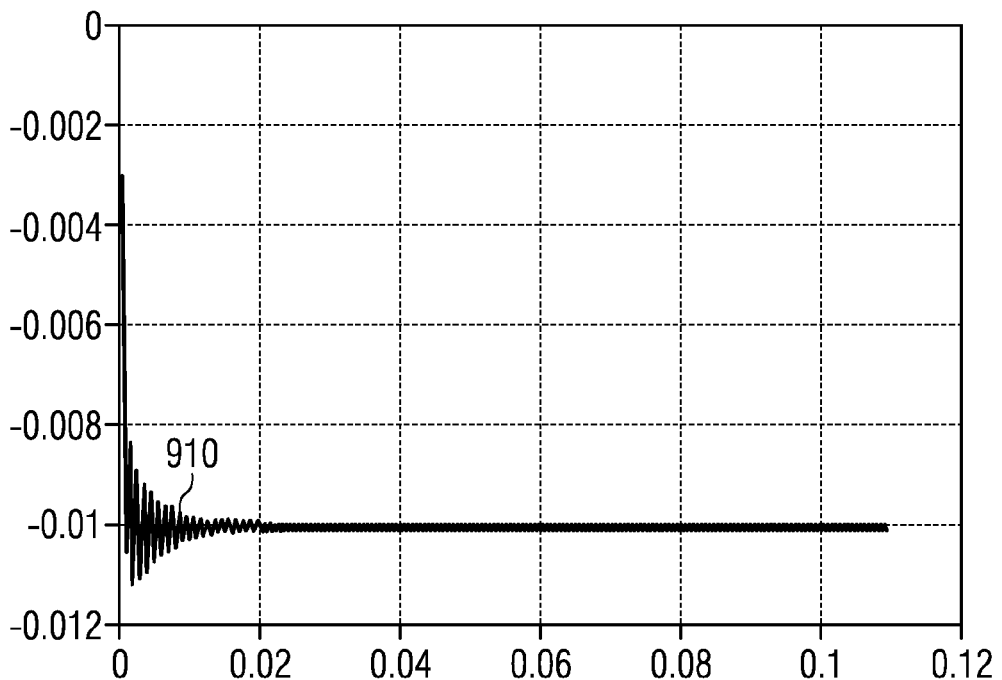
FIG. 9 shows a graphic visualizing a convergent behavior due to an offset compensation in a microphone package.

FIG. 9 illustrates the convergent behavior of the offset compensation 910 for the first digital signal value previously explained in the context of FIG. 5. Similar results are observed for gain mismatch. Starting at 0, the offset compensation value 910 follows a damped oscillator curve converging to a value of approximately −0.01. The largest amount of decrease in oscillation amplitude thereby occurs between 0 and 0.02.

Figure 10:
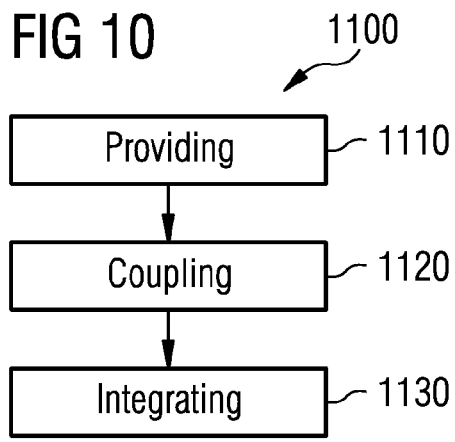
FIG. 10 shows a flow chart of a method for providing a microphone package according to an embodiment.

FIG. 10 shows a flow chart of a method 1100 for providing a microphone package according to an embodiment. Method 1100 comprises a providing 1110 of an integrated circuit. The integrated circuit therein comprises a first analog-to-digital converter to provide a first digital signal, a second analog-to-digital converter to provide a second digital signal and a circuit configured to provide a microphone signal based on the first digital signal and the second digital signal. Method 1100 also comprises a coupling 1120 of a microphone to the first analog-to-digital converter and to the second analog-to-digital converter. Method 1100 further comprises integrating 1130 the microphone, the first analog-to-digital converter and the second analog-to-digital converter in a common package.

Figure 11:
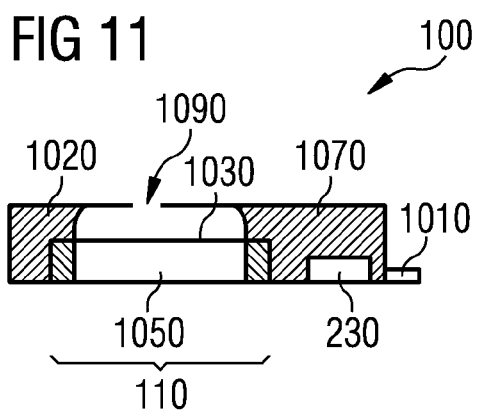
FIG. 11 shows a cross-section of an embodiment of a microphone package.

FIG. 11 illustrates a section view of an embodiment of a microphone package 100. The microphone package 100 includes a microphone 110 and an ASIC 230. The microphone 110 is implemented as a MEMS microphone and comprises a membrane 1030 which seals a back volume 1050. A cap 1070 encloses the microphone 110 and the ASIC 230 at least partly. A sound opening or sound port 1090 is constituted by an opening in the cap 1070 which allows pressure variations to enter into the package so as to cause a deflection of the membrane 1030. The deflection of the membrane 1030 changes the capacitance of the microphone 110 and serves to generate the microphone signal. The sound signal generated by the microphone package 100 is provided at a terminal 1010 of the microphone package 100. The ASIC 230 is coupled to the microphone 110 and to the terminal 1010. The ASIC 230 and the MEMS microphone 110 are in one embodiment formed on separate substrates. The MEMS microphone 110 and the ASIC 230 are both mounted to a common Printed Circuit Board 1040 (PCB), which also provides for the external terminal 1010. The Printed Circuit Board 1040 and the cap 1070 forms a common housing which enclose the microphone and the ASIC 230 device at least partly, leaving at least an opening for the sound port 1090. The MEMS microphone 110 and the ASIC 230 may be electrically coupled by means of the Printed Circuit Board 1040 or by means of additional circuitry.

In the embodiment of FIG. 11, the microphone 110 and the ASIC 230 are both sealed by a common sealing compound 1020 within the microphone package 100. The sealing compound 1020 does, however, not close the sound port 1090. The back volume 1050 may be hermetically sealed or have a small ventilation channel so as to avoid compression of the air within the back volume 1050.

In further implementations, the sound opening 1090 may also be formed below the membrane 1030, i.e., at the bottom of the package, as for example, illustrated in FIG. 12. Further embodiments of packages comprise additional terminals so as to be able to provide a supply voltage and ground connection. This may provide for the possibility to connect all components within the microphone package in one single assembly step to further circuitry, printed circuit boards or the like by means of the terminal(s).

In other words, according to some embodiments, a back volume of the microphone is at least partly delimited by constituents the package. The back volume is on the opposite side of the membrane of the microphone than the sound port. The membrane is deflected against a pressure of a gas within the back volume when pressure variations enter through the sound port of the package. According to some embodiments, the back volume is delimited by the Printed circuit board or a common substrate of the package. According to other embodiments, the back volume is delimited by a cap mounted on a common substrate of the pack-age. According to some embodiments, the dimensions of the package are equal to or less than 15 mm×15 mm×15 mm.

Figure 12:
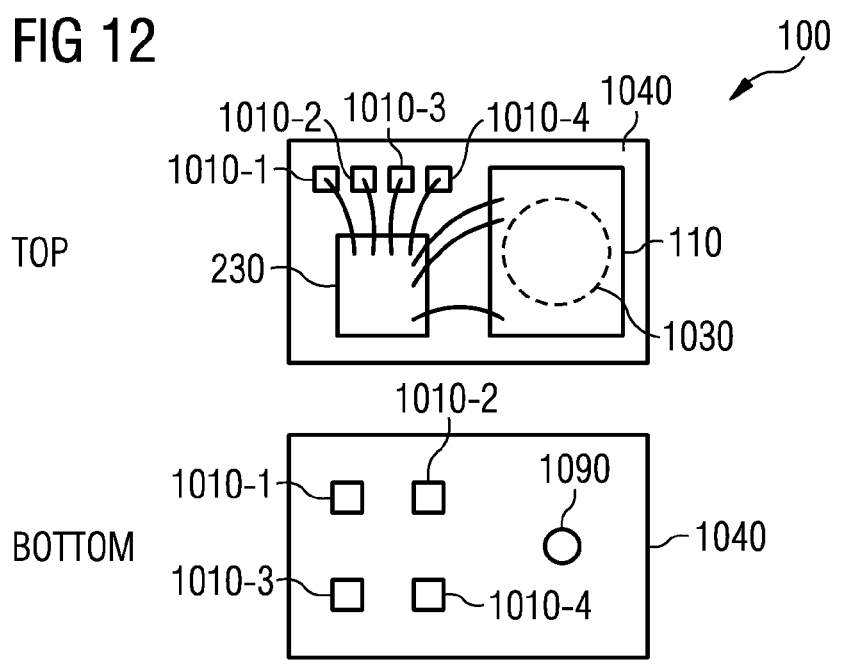
FIG. 12 shows a top-and-bottom view of a further embodiment of a microphone package.

FIG. 12 illustrates a top-and-bottom view of a further embodiment of a microphone package having a different geometry. The difference between FIG. 12 and the implementation of the embodiment of FIG. 11 is shortly summarized below. The sound port 1090 is formed within the PCB 1040 in FIG. 12 so that the cap, which is not shown, forms the back volume for the MEMS microphone 110. The terminals 1010-1 to 1010-4 of the microphone package 100 are situated on the bottom of the common PCB 1040 which may help to reduce the area the microphone package 100 consumes overall. The MEMS microphone 110 and the ASIC 230 are electrically coupled by means of bonding wires. The ASIC 230 and the terminals 1010-1 to 1010-4 are also connected by means of bonding wires. The PCB 1040 transfers the terminals 1010-1 to 1010-4 from the inside of the package 100 to the outside of the package 100.

During production of the microphone package 100, the substrate of the MEMS microphone 110 and the ASIC 230 are attached to the PCB 1040 before they are electrically coupled by the bonding wires. Finally, the package may be sealed hermetically by applying the cap from the top side.

A characteristic of the ASIC 230 device may be tuned to fit the MEMS microphone 110 and the particular package design used. Identical MEMS microphones 110 may be used in different package designs providing for a modified microphone signal with similar characteristics or signal-to-noise ratios. The characteristic or the filter coefficients of the ASIC 230 may be determined for each combination of a MEMS microphone 110 and a package design, so that appropriately pre-configured ASICs may be used within the different combinations.

Alternatively, the ASIC characteristic may be programmable after assembly. Product variations may be compensated for in that a frequency response of the unmodified microphone signal can then be determined after assembly of the package. The ASIC 230 characteristic may then be programmed so that a desired spectral behavior is achieved for the modified microphone signal of each individual package, which may then also account for process variations, e.g., in the processes used to manufacture the MEMS microphone.

The microphone packages according to the previously-described example embodiments may, for example, be used in mobile telecommunication devices as, for example, mobile phones or the like. Any application requiring the recording or monitoring of ambient sound may use microphone packages according to example embodiments. For example, in automotive applications, hands-free car kits may use example embodiments of microphone packages to achieve enhanced sound quality. For example, headsets for call center personnel or the like may further use microphone packages according to an example embodiment in order to increase the signal quality as experienced by a customer of the call center. Generally speaking, microphone packages according to some example embodiments provide additional benefits in any application where ambient sound is to be recorded or monitored or to be further processed by means of further electrical circuitry on a printed circuit board or the like.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A microphone package comprising:
a microphone;
a first analog-to-digital converter coupled to the microphone to provide a first digital signal;
a second analog-to-digital converter coupled to the microphone to provide a second digital signal;
a circuit coupled to the first analog-to-digital converter and the second analog-to-digital converter to provide a microphone signal, wherein the circuit determines the microphone signal using a combination of the first digital signal, a first weighting coefficient, the second digital signal and a second weighting coefficient; and
a controller configured to control a mode of operation of the circuit and to change the mode of operation when an input to the first analog-to-digital converter or the second analog-to-digital converter exceeds a predetermined threshold, the controller further being configured to determine the first weighting coefficient for the first digital signal and the second weighting coefficient for the second digital signal using a level of the input to the first analog-to-digital converter or the second analog-to-digital converter.

2. The microphone package of claim 1, wherein a first dynamic range of the first analog-to-digital converter differs from a second dynamic range of the second analog-to-digital converter.

3. The microphone package of claim 1, wherein the microphone signal corresponds to the first digital signal or to the second digital signal.

4. The microphone package of claim 1, wherein the circuit is configured to determine the microphone signal using a sum of a product of the first digital signal and the first weighting coefficient and a product of the second digital signal and the second weighting coefficient.

5. The microphone package of claim 1, wherein the first analog-to-digital converter, the second analog-to-digital converter and the circuit are integrated in an application specific integrated circuit.

6. The microphone package of claim 5, wherein the application specific integrated circuit and the microphone are mounted on a common integrated circuit board.

7. The microphone package of claim 1, further comprising a single output port to provide the microphone signal.

8. The microphone package of claim 1, further comprising a common housing enclosing the microphone, the first analog-to-digital converter, the second analog-to-digital converter and the circuit.

9. The microphone package of claim 1, further comprising a sealing compound enclosing at least one of the microphone, the first analog-to-digital converter, the second analog-to-digital converter and the circuit.

10. The microphone package of claim 1, further comprising terminals to electrically connect all components of the microphone package to further circuitry.

11. The microphone package of claim 1, further comprising a single supply voltage terminal to receive a common supply voltage for the microphone, the first analog-to-digital converter, the second analog-to-digital converter and the circuit.

12. The microphone package of claim 1, further comprising a sound port in the microphone package to enable pressure variations at a membrane of the microphone within the microphone package.

13. The microphone package of claim 1, wherein the microphone is implemented as a micro-electro-mechanical system.

14. The microphone package of claim 1, wherein the microphone comprises a first membrane portion having a first sensitivity, the first membrane portion being configured to provide a first input signal to the first analog-to-digital converter, and a second membrane portion having a second sensitivity, the second membrane portion being configured to provide a second input signal to the second analog-to-digital converter.

15. A microphone package comprising:
  a micro-electro-mechanical microphone;
  a first analog-to-digital converter coupled to the micro-electro-mechanical microphone to provide a first digital signal;
  a second analog-to-digital converter coupled to the micro-electro-mechanical microphone to provide a second digital signal;
  a circuit coupled to the first analog-to-digital converter and the second analog-to-digital converter, the circuit being configured to provide a microphone signal to an output terminal of the microphone package, wherein the circuit determines the microphone signal using a combination of the first digital signal, a first weighting coefficient, the second digital signal and a second weighting coefficient; and
  a controller configured to control a mode of operation of the circuit and to change the mode of operation when an input to the first analog-to-digital converter or the second analog-to-digital converter exceeds a predetermined threshold, the controller further being configured to determine the first weighting coefficient for the first digital signal and the second weighting coefficient for the second digital signal using a level of an input to the first analog-to-digital converter or the second analog-to-digital converter.

16. A method for providing a microphone package, the method comprising:
  providing an integrated circuit comprising:
    a first analog-to-digital converter to provide a first digital signal;
    a second analog-to-digital converter to provide a second digital signal;
    a circuit to provide a microphone signal using a combination of the first digital signal, a first weighting coefficient, the second digital signal and a second weighting coefficient; and
    a controller configured to control a mode of operation of the circuit and to change the mode of operation when an input to the first analog-to-digital converter or the second analog-to-digital converter exceeds a predetermined threshold, the controller further being configured to determine the first weighting coefficient for the first digital signal and the second weighting coefficient for the second digital signal using a level of an input to the first analog-to-digital converter or the second analog-to-digital converter;
  coupling a microphone to the first analog-to-digital converter and to the second analog-to-digital converter; and
  integrating the microphone, the first analog-to-digital converter and the second analog-to-digital converter in a common package.

* * * * *